United States Patent
Suzuki et al.

(10) Patent No.: US 10,429,554 B2
(45) Date of Patent: Oct. 1, 2019

(54) HALF MIRROR, METHOD FOR MANUFACTURING THE SAME AND LIGHTING UNIT USING THE SAME

(71) Applicant: STANLEY ELECTRIC CO., LTD., Meguro-ku, Tokyo (JP)

(72) Inventors: Yoshio Suzuki, Machida (JP); Kazushige Kuroki, Hadano (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 174 days.

(21) Appl. No.: 15/378,481

(22) Filed: Dec. 14, 2016

(65) Prior Publication Data

US 2017/0176655 A1   Jun. 22, 2017

(30) Foreign Application Priority Data

Dec. 18, 2015  (JP) ................. 2015-247400

(51) Int. Cl.
*G02B 5/08* (2006.01)
*C23C 14/00* (2006.01)
(Continued)

(52) U.S. Cl.
CPC ........ *G02B 5/0808* (2013.01); *C23C 14/0036* (2013.01); *C23C 14/083* (2013.01);
(Continued)

(58) Field of Classification Search
None
See application file for complete search history.

(56) References Cited

U.S. PATENT DOCUMENTS 5,481,409 A * 1/1996 Roberts ............... B60Q 1/2665
250/205
5,672,243 A   9/1997 Hsia et al.
(Continued)

FOREIGN PATENT DOCUMENTS

DE   20021657 U1   5/2002
EP   756131 A1    1/1997
(Continued)

OTHER PUBLICATIONS

Extended European Search Report (EESR) (in English) dated May 17, 2017 issued in counterpart European Application No. 16204283.2.

Primary Examiner — Derek S. Chapel
(74) Attorney, Agent, or Firm — Holtz, Holtz & Volek PC

(57) ABSTRACT

A half mirror, a method for manufacturing the half mirror and a lighting unit using the half mirror can include a base material and a half mirror layer formed on the base material. The half mirror layer can include a chrome oxide layer, which is made by only a sputtering method, and can be configured to perform a high thermal resistance. Accordingly, the half mirror cannot crack even under various circumstances such that repeat low/high temperatures. Thus, the disclosed subject matter can provide half mirrors having a high durability such as a thermal resistance and methods for manufacturing such the half mirrors in simple manufacturing processes, and also can provide lighting units using the half mirror having a high durability, which can maintain a stable reflectivity for a long term and which can also maintain a good appearance for a long-term use because the half mirror can prevent cracking therein.

9 Claims, 8 Drawing Sheets

(51) Int. Cl.
  *C23C 14/08*    (2006.01)
  *C23C 14/34*    (2006.01)
  *G02B 27/14*    (2006.01)
  *C23C 14/20*    (2006.01)
  *F21S 41/20*    (2018.01)
  *F21S 41/275*   (2018.01)
  *C23C 14/58*    (2006.01)

(52) U.S. Cl.
  CPC ........ *C23C 14/205* (2013.01); *C23C 14/3407* (2013.01); *C23C 14/5853* (2013.01); *F21S 41/275* (2018.01); *F21S 41/28* (2018.01); *G02B 27/14* (2013.01); *G02B 27/142* (2013.01); *G02B 27/144* (2013.01)

(56) References Cited

U.S. PATENT DOCUMENTS

| | | |
|---|---|---|
| 2002/0076568 A1 | 6/2002 | Reichert et al. |
| 2016/0027968 A1 | 1/2016 | Yoshimizu et al. |
| 2016/0268770 A1 | 9/2016 | Tazawa et al. |

FOREIGN PATENT DOCUMENTS

| | | | | |
|---|---|---|---|---|
| JP | 2003115206 A | * | 4/2003 | .............. F21S 41/28 |
| JP | 2007087629 A | * | 4/2007 | |
| JP | 2010128440 A | | 6/2010 | |

\* cited by examiner

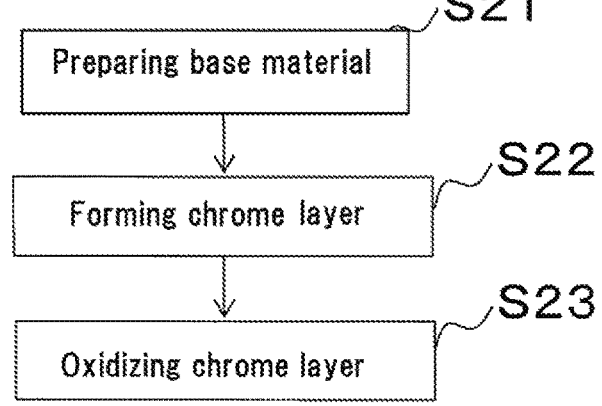
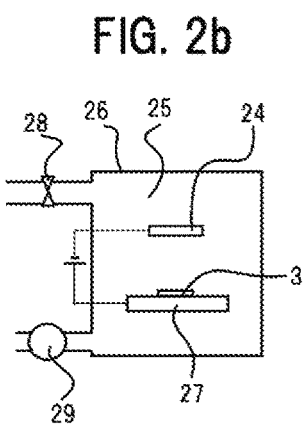

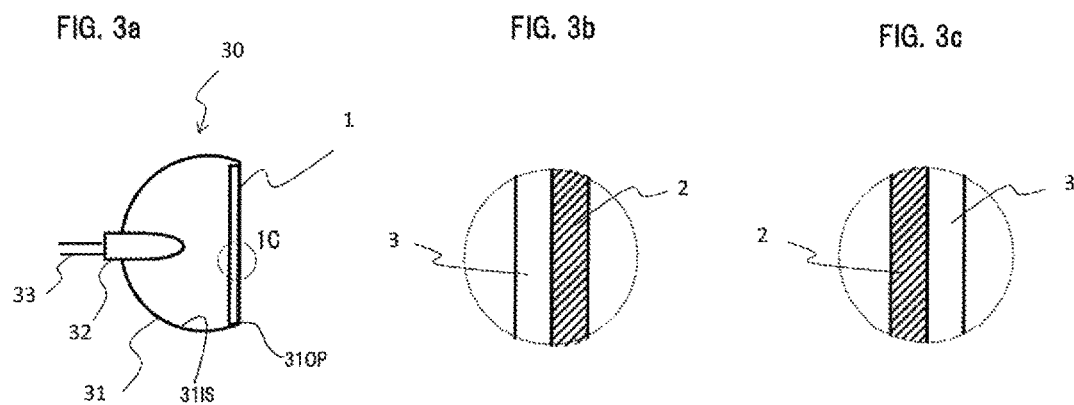

FIG. 4

| Test sample | Forming condition of Cr | | | | Oxygen composition | | O/Cr Ratio | | | Thermal resistance | Moisture resistance | Acid resistance | Alkali resistance | Low thermal resistance |
|---|---|---|---|---|---|---|---|---|---|---|---|---|---|---|
| | Pressure (Pa) | Power (W) | Forming speed (nm/s) | Layer thickness (nm) | Maximum (at%) | Minimum (at%) | Maximum | Minimum | Central line | | | | | |
| Embodiment 1 | 1.5 | 1500 | 2.1 | 26 | 46 | 35 | 0.86 | 0.62 | 0.74 | ○ | ○ | ○ | ○ | ○ |
| Embodiment 2 | 1.6 | 1500 | 3.3 | 65 | 42 | 37 | 0.78 | 0.55 | 0.67 | ○ | ○ | ○ | ○ | ○ |
| Embodiment 3 | 2.6 | 1500 | 2.2 | 34 | 41 | 35 | 0.79 | 0.69 | 0.74 | ○ | ○ | ○ | ○ | ○ |
| CE-1 | 0.09 | 1500 | 1.6 | 25 | 14 | 12 | 0.17 | 0.14 | 0.13 | × | ○ | ○ | ○ | × |
| CE-2 | 0.4 | 1500 | 2.1 | 15 | 20 | 19 | 0.28 | 0.24 | 0.25 | × | ○ | ○ | ○ | × |
| CE-3 | 0.8 | 1500 | 2.4 | 30 | 38 | 28 | 0.53 | 0.38 | 0.39 | × | ○ | ○ | ○ | × |
| CE-4 | 1.5 | 3000 | 3.3 | 25 | 20 | 18 | 0.27 | 0.22 | 0.26 | × | ○ | ○ | ○ | × |
| CE-5 | 1.5 | 6000 | 4.9 | 25 | 14 | 12 | 0.2 | 0.17 | 0.16 | × | ○ | ○ | ○ | × |

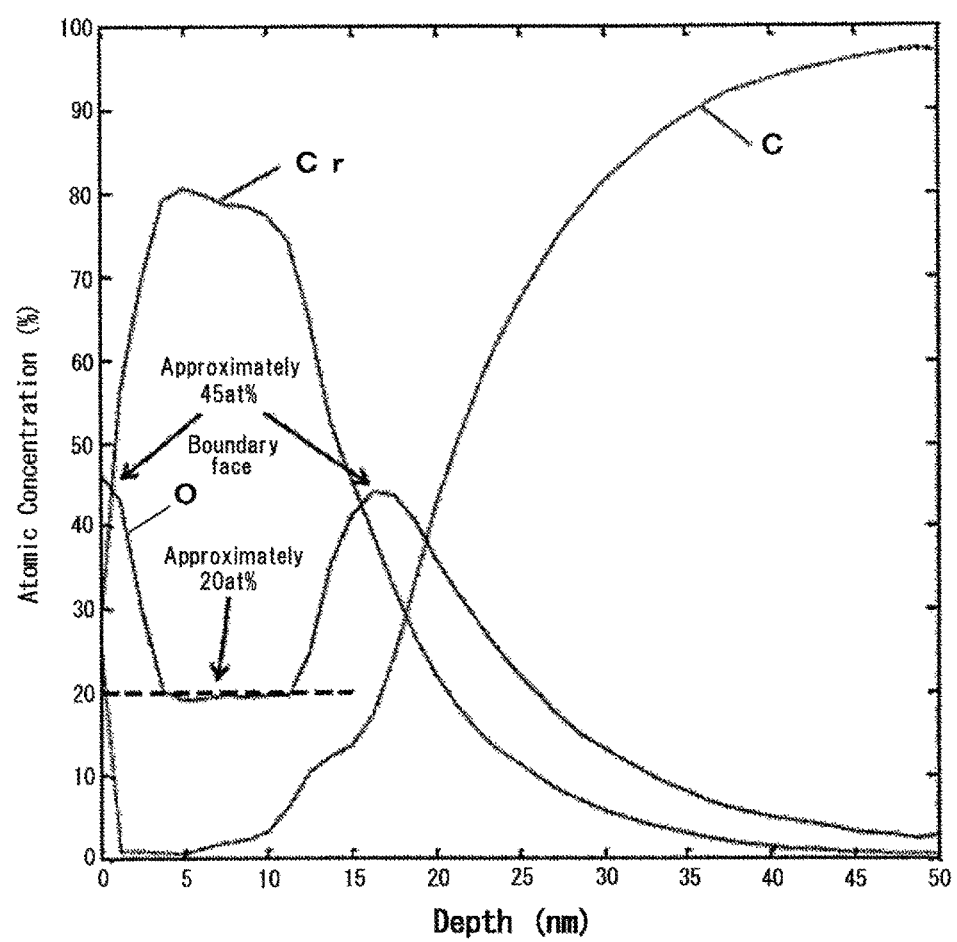

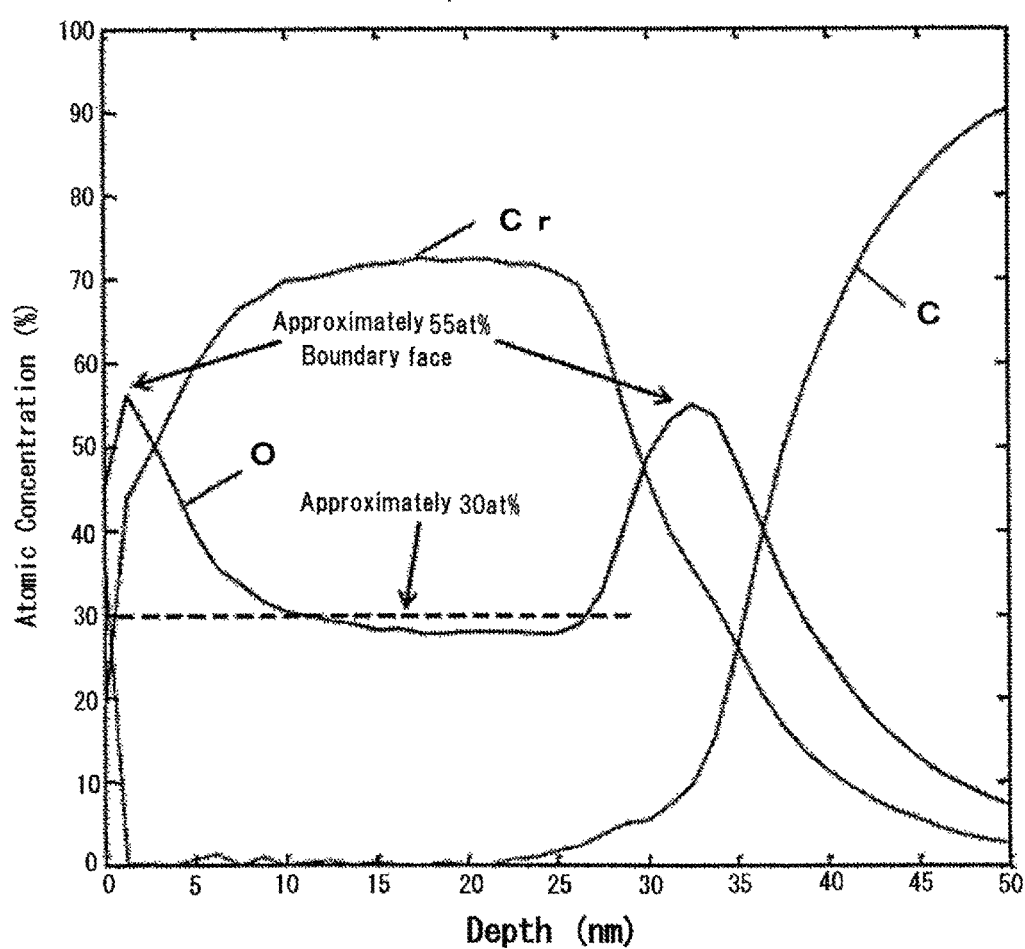

HALF MIRROR, METHOD FOR MANUFACTURING THE SAME AND LIGHTING UNIT USING THE SAME

This application claims the priority benefit under 35 U.S.C. § 119 of Japanese Patent Application No. 2015-247400 filed on Dec. 18, 2015, which is hereby incorporated in its entirety by reference.

BACKGROUND

1. Field

The presently disclosed subject matter relates to half mirrors, methods for manufacturing the half mirrors and lighting units using the half mirror, and more particularly to the half mirrors having a high durability such as a thermal resistance and the like, which can be manufactured by a simple manufacturing method. Thus, the lighting unit using the half mirror can maintain a stable reflectivity for a long term, and also can maintain a good appearance for a long-term use because the half mirror can prevent cracking therein even under tough circumstances.

2. Description of the Related Art

Half mirrors have been used as a light-emitting surface not only for vehicle lamps incorporated into vehicles, motorcycles and the like but also for lighting apparatuses such as wall washers, room lights, outdoor luminaires, etc. For example, a conventional lighting apparatus using a half mirror is disclosed in Patent Document No. 1 (Japanese Patent Application Laid Open JP 2007-87,629). FIG. 8a is a schematic cross-sectional view depicting a conventional lighting apparatus using a half mirror and FIG. 8b is a partial cross-sectional view depicting the half mirror shown in FIG. 8a, which are disclosed in Patent Document No. 1.

The conventional lighting apparatus 50 includes: a reflector 51 having an opening and an inner surface used as a reflective surface; a socket 52 having an electric supply line 52A attached to the reflector 51; a light source 53 attached to the socket 52 and facing the opening of the reflector 51; a transparent cover 54 having an outer surface facing the light source 53 and attached to the opening of the reflector 51; and a transparent metallic layer 55 formed on the outer surface of the transparent cover. Patent Document 1 discloses that the transparent metallic layer 55 is one of materials such as silver (Ag), aluminum (Al), molybdenum (Mo), Titanium (Ti), tantalum (Ta), platinum (Pt), palladium (Pd), gold (Au), chromium (Cr) and alloy made by the above materials, and a multi-layer interference layer made from high and low refractive index materials.

A conventional vehicle lamp using a half mirror is also disclosed in Patent Document No. 2 (Japanese Patent Application Laid Open JP 2003-115,206). The conventional vehicle lamp is provide the half mirror having a uniform thickness on a large lens, which is curved in three-dimensional directions. The conventional vehicle lamp includes an inner lens and an outer lens, which may be used as the half mirror made by a sputtering.

When the above-described half mirrors are manufactured, for example, by coating chromium on the lens using sputtering method, and when the half mirrors are heat-shocked such as repeating a low temperature and a high temperature, small cracks may occur in the half mirrors. Accordingly, the conventional half mirrors may not maintain a stable reflectivity for a long term, and also may not maintain a good appearance for a long-term use because the cracks may be caused under tough circumstances. Additionally, when the light source includes a laser device emitting light having a high emitting-intensity, the light having the high emitting-intensity may degrade qualities of the half mirrors.

The above-referenced Patent Documents and additional Documents are listed below and are hereby incorporated with their English abstracts and specification in their entireties.
1. Patent Document No. 1: Japanese Patent Application Laid Open JP 2007-87629
2. Patent Document No. 2: Japanese Patent Application Laid Open JP 2003-115206
3. Patent Document No. 3: U.S. Patent Publication No. 2016-0268770
4. Patent Document No. 4: U.S. Patent Publication No. 2016-0027968

The disclosed subject matter has been devised to consider the above and other problems, characteristics and features. Thus, exemplary embodiments of the disclosed subject matter can include half mirrors having a high durability such as a thermal resistance, which can prevent the half mirrors from cracking even under various tough circumstances such that repeat a low temperature and a high temperature. Additionally, exemplary embodiments of the disclosed subject matter can include methods for manufacturing the half mirrors having a high reliability in simple manufacturing processes.

SUMMARY

The presently disclosed subject matter has been devised in view of the above and other characteristics, desires, and problems in the conventional art. An aspect of the disclosed subject matter can provide half mirrors having a high durability such as a thermal resistance, which can prevent the half mirrors from cracking even under various tough circumstances such that repeat a low temperature and a high temperature. One of other aspects of the disclosed subject matter can include methods for manufacturing such the half mirrors having a high durability in simple manufacturing processes. Another of the other aspects of the disclosed subject matter can provide lighting units using the half mirror having a high durability, which can maintain a stable reflectivity for a long term and also can maintain a good appearance for a long-term use because the half mirror can prevent cracking therein even under tough circumstances.

According to an aspect of the disclosed subject matter, a half mirror can include: a base material having a first surface and a second surface formed in a substantially planar shape and made from a transparent material; and a half mirror layer formed on at least one of the first surface and the second surface of the base material as a chromium oxide layer, wherein a minimum of a ratio of oxygen to chromium in a thickness direction of the half mirror layer toward the base material is 0.55 or more.

In the above-described exemplary half mirrors, a maximum of the ratio of oxygen to chromium in the thickness direction of the half mirror layer can be 0.86 or less, and also a minimum amount of oxygen in the chromium oxide layer in the thickness direction of the half mirror layer can be 35 atomic percent or more. Additionally, a maximum amount of oxygen in the chromium oxide layer in the thickness direction of the half mirror layer can be 46 atomic percent or less, and a ratio of oxygen to chromium on a central line in the thickness direction of the half mirror layer can be 0.67 or more.

According to the above-described exemplary half mirrors, because the chromium oxide layer used as the half mirror layer is disposed on the base material, the half mirrors can have a high thermal resistance including thermal resistance against a low temperature, and therefore cannot crack even under various tough circumstances such as being repeatedly subjected to low and high temperatures. Accordingly, the disclosed subject matter can provide half mirrors having a high durability such as a and thermal resistance, which can prevent the half mirrors from cracking even under various tough circumstances such as being repeatedly subjected to low and high temperatures.

According to the one of the other aspects of the disclosed subject matter, an exemplary method for manufacturing the half mirror can include: preparing the base material; forming a chromium layer on the base material by a sputtering method, wherein a pressure of argon gas in a coating chamber of a sputtering equipment is more than 1.5 Pa, and a power is less than 1,500 watts when a direct current (DC) is applied between a positive electrode connecting the base material and a negative electrode connecting a chromium target; and forming the chromium oxide layer on the base material by injecting oxygen or a gas including the oxygen in the coating chamber of the sputtering equipment.

In this case, the above-described half mirrors can be manufactured by the sputtering equipment. Therefore, the disclosed subject matter can provide methods for manufacturing such the half mirrors having a high durability in simple manufacturing processes.

According to another of the other aspects of the disclosed subject matter, an exemplary lighting unit using the half mirror can include: a casing having an opening and an inner surface, and the opening of the casing attached to the half mirror; and a light source attached to the casing and facing the half mirror. In this case, the half mirror can be used as a light-emitting surface for the lighting unit. Thus, the disclosed subject matter can provide lighting units using the half mirror having a high durability, which can maintain a stable reflectivity for a long term and also can maintain a good appearance for a long-term use because the half mirror can prevent cracking therein even under tough circumstances.

BRIEF DESCRIPTION OF THE DRAWINGS

These and other characteristics and features of the disclosed subject matter will become clear from the following description with reference to the accompanying drawings, wherein:

FIG. 2a is a schematic block diagram depicting an exemplary method for manufacturing the half mirror shown in FIG. 1, and FIG. 2b is a schematic diagram depicting a sputtering equipment used for manufacturing the half mirror;

FIG. 3a is a schematic side cross-sectional view showing an exemplary embodiment of a lighting unit using the half mirror shown in FIG. 1, and FIGS. 3b and 3c are partial enlarged cross-sectional views taken along circle 1C shown in FIG. 3a showing an exemplary location and another exemplary location of the half mirror, respectively;

FIG. 4 is a table showing evaluation results of embodiments and comparative embodiments of the half mirror;

FIG. 6 is a graph showing measuring data of evaluation results of comparative embodiment CE-1;

FIG. 7 is a graph showing measuring data of evaluation results of comparative embodiment CE-3; FIG. 8b is a partial cross-sectional view depicting the half mirror shown in FIG. 8a.

DETAILED DESCRIPTION OF EXEMPLARY EMBODIMENTS

Figure 1:
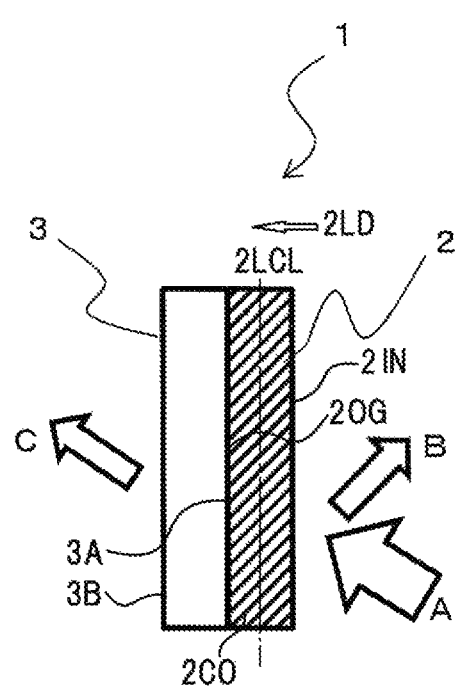
FIG. 1 is a schematic cross-sectional view showing an exemplary embodiment of a half mirror made in accordance with principles of the presently disclosed subject matter.
Figure 5:
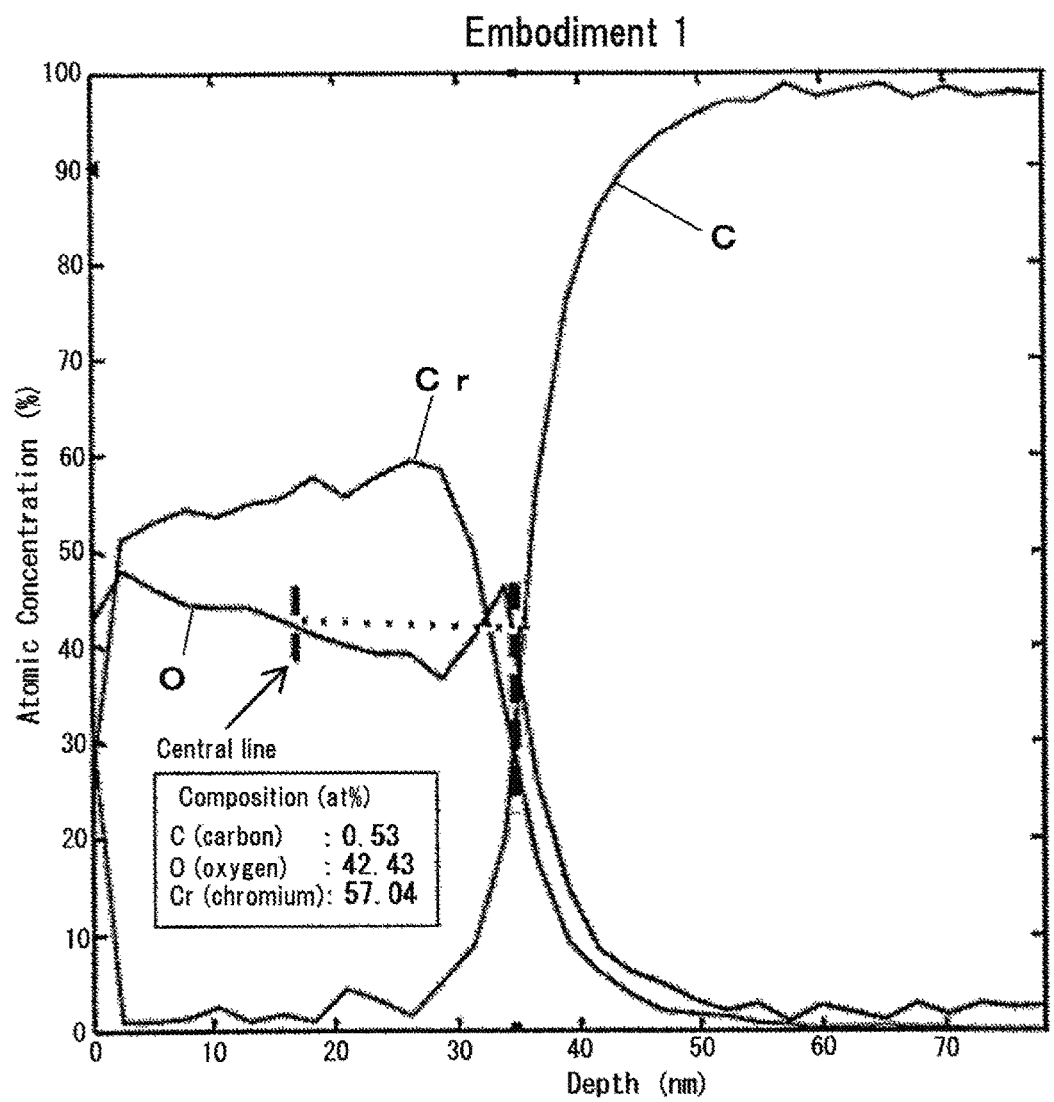
FIG. 5 is a graph showing measuring data of evaluation results of Embodiment 1.
Figure 8A:
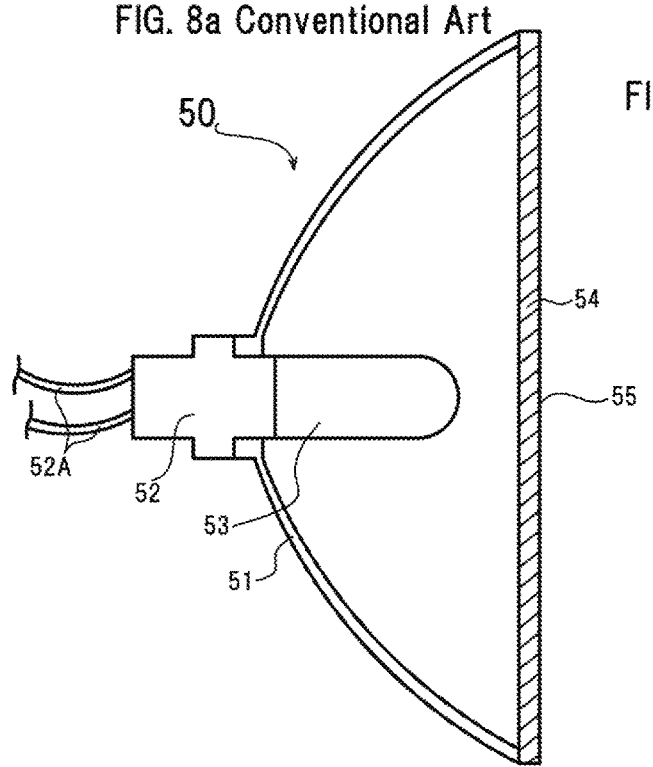
FIG. 8a is a schematic cross-sectional view depicting a conventional lighting apparatus using a half mirror.
Figure 8B:
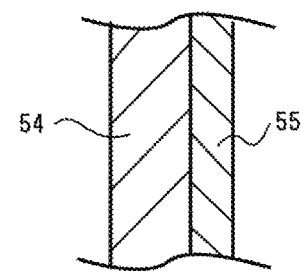

The disclosed subject matter will now be described in detail with reference to FIG. 1 to FIG. 7, in which the same, similar, or corresponding elements use the same reference marks. FIG. 1 is a schematic cross-sectional view showing an exemplary embodiment of a half mirror made in accordance with principles of the presently disclosed subject invention. The half mirror 1 can include a base material 3 having a first surface 3A and a second surface 3B formed in a substantially planar shape, and a half mirror layer 2 having a central line 2LCL, an incident surface 2IN and an outgoing surface 2OG formed in a substantially film shape and disposed on at least one of the first surface 3A and the second surface 3B of the base material 3.

The half mirror 1 can receive Light A from the incident surface 2IN of the half mirror layer 2 and can reflect Light B, which is a part of Light A, from the outgoing surface 2OG of the half mirror layer 2. The half mirror 1 can emit Light C, which is another part of Light A, from the second surface 3B of the base material 3, when the half mirror layer 2 is disposed on the first surface 3A of the base material 3 so that the outgoing surface 2OG thereof faces the first surface 3A, as shown in FIG. 1. Accordingly, as the base material 3, which may optically transmits Light C, a transparent material such as a polycarbonate resin, an acrylic resin and the like can be used.

The half mirror layer 2 can include a chromium oxide layer 2CO. With respect to the chromium oxide layer 2CO, a distributional minimum of a ratio of oxygen to chromium in a thickness direction 2LD of the half mirror layer 2 toward the base material 3 can be 0.55 or more, and a distributional maximum of the ratio of oxygen to chromium in the thickness direction 2LD of the half mirror layer 2 toward the base material 3 can be 0.86 or less. Additionally, the ratio of oxygen to chromium on the central line 2LCL, which extends on a center between the incident surface 2IN and the outgoing surface 2OG of the half mirror layer 2, in the thickness direction 2LD of the half mirror layer 2, can be 0.67 or more.

In the embodiment of the half mirror layer 2, a distributional minimum of oxygen in the chromium oxide layer 2CO in the thickness direction 2LD of the half mirror layer 2 can be 35 atomic percent or more, and a distributional maximum of oxygen in the chromium oxide layer 2CO in the thickness direction 2LD of the half mirror layer 2 can be 46 atomic percent or less.

The half mirror 1, in which the chromium oxide layer 2CO is used as the half mirror layer 2 and is disposed on the base material 3, can have a high thermal resistance including thermal resistance against a low temperature, and therefore cannot crack even under various circumstances such as being repeatedly subjected to low and high temperatures. Accordingly, the half mirror 1 can maintain a stable reflectivity for a long term, and also can maintain a good appearance for long-term use because the half mirror 1 cannot crack even under tough circumstances as described above.

As the base material 3, a polycarbonate resin, which is a lightweight material and has an excellent formability, can be used, as described above. As the half mirror layer 2, the half mirror 1 can be made by disposing only the chromium oxide layer 2CO on at least one of the first surface 3A and the second surface 3B of the base material 3 without a protection film. Accordingly, the half mirror layer 2 can have a high thermal resistance including thermal resistance against a low temperature in addition to excellent moisture resistance and chemical resistance to acids and alkalis when a distributional minimum of 0.55 or more of a ratio of oxygen to chromium in the chromium oxide layer 2CO in the thickness direction 2LD of the half mirror layer 2 is used as the chromium oxide layer 2CO for the half mirror layer 2.

A thickness of the chromium oxide layer 2CO can be determined in accordance with a desirable reflectivity and a preferable transmissivity as usage, for example, can be between 10 nanometers and 40 nanometers. An exemplary method for manufacturing the half mirror 1 of the invention will now be described with reference to FIG. 2a and FIG. 2b, in which FIG. 2a is a schematic block diagram depicting an exemplary method for manufacturing the half mirror shown in FIG. 1, and FIG. 2b is a schematic diagram depicting a sputtering equipment used for manufacturing the half mirror.

Process 1 is preparing the base material 3 as shown in S21 of FIG. 2a.

Process 2 is forming a chromium layer on the base material 3 by a sputtering method as shown in S22. More specifically, a chromium target 24 can arranged in a coating chamber 25 of a sputtering equipment 26, and the base material 3 can be held as a positive electrode by a base holder 27 at a position where the base material 3 faces the chromium target 24 setting as a negative electrode. Then, an argon gas used as a sputtering gas can fill at a prescribed pressure into the coating chamber 25 via an injection valve 28 after being exhausted in the coating chamber 25 via an exhaust pump 29, and the argon gas is ionized by applying direct current (DC) between the positive electrode connecting the base material 3 and the negative electrode connecting the chromium target 24, whereby the chromium layer can be formed on the base material 3 by sputtering the chromium target 24.

While forming the chromium oxide layer 2CO on the base material 3 by a sputtering method, the prescribed pressure of the argon gas in the coating chamber 25 of the sputtering equipment 26 can be more than 0.8 Pascal (Pa), and preferably can be more than 1.5 Pa. The DC applied between the positive electrode connecting the base material 3 and the negative electrode connecting the chromium target 24 can be less than 1,500 watts in a power equivalent including a load described above.

Process 3 is forming the chromium oxide layer 2CO on the base material 3 by injecting oxygen (O) or a gas including the oxygen (e.g., air) via the injection valve 28 and finishing the half mirror 1 as shown in S23 of FIG. 2a. The half mirror 1 including the chromium oxide layer 2CO having the above-described distribution of the ratio of oxygen to chromium in the thickness direction 2LD of the half mirror layer 2 and/or the above-described amount of the oxygen in the chromium oxide layer 2CO can be manufactured by the exemplary manufacturing method described above.

The half mirror 1, which is manufactured by the exemplary manufacturing method, can perform a high thermal resistance including the thermal resistance against a low temperature, and therefore cannot crack even under various circumstances such that repeat a low temperature and a high temperature. Evaluating results of the half mirror 1 will be described later.

Next, exemplary embodiments of a vehicle lamp using the half mirror will now be described with reference to FIG. 3a to FIG. 3c, in which FIG. 3a is a schematic side cross-sectional view showing an exemplary embodiment of a lighting unit using the half mirror 1 shown in FIG. 1, and FIGS. 3b and 3c are partial enlarged cross-sectional views taken along circle 1C shown in FIG. 3a showing an exemplary location and another exemplary location of the half mirror 1, respectively.

The lighting unit 30 can include: a casing 31 having an opening 310P; the half mirror 1 attached to the opening 310P of the casing 31; and a light source 32 having an electric supply line 33 facing the half mirror 1 and attached to the casing 31. The half mirror 1 including the half mirror layer 2, which is disposed on the base material 3, can be located so that the base material 3 faces the light source 32 in order for the half mirror layer 2 to become a light-emitting surface of the lighting unit 30 shown FIG. 3b.

As the light source 32, a laser light-emitting apparatus, which can emit various color lights including while color light and which is disclosed in Patent Document No. 3, can be used, and also a surface mount light-emitting device, which can emit various color lights including while color light and which is disclosed in Patent Document No. 4, can be used. Patent Documents No. 3 and No. 4 are owned by Applicant of this disclosed subject matter. Accordingly, detail descriptions of the light source 32 will be abbreviated here.

When the light source 32 turns on, various color lights emitted from the light source 32 can transmit the half mirror 1, and therefore can enable the lighting unit 30 to behave various lighting units. When the light source 32 turns off, the half mirror 1 can reflect outward lights such as sunlight, and therefore can enable a middle of the lighting unit 30 to disappear from view. Thus, the disclose subject matter can provide the lighting unit 30 having an excellent appearance.

In addition, the half mirror 1 can perform a high thermal resistance including the thermal resistance against a low temperature in addition to excellent moisture resistance and chemical resistance to acids and alkalis, and also can maintain a stable reflectivity and a good appearance for a long-term use because the half mirror 1 cannot crack even under tough circumstances described above. Accordingly, the lighting unit 31 using the half mirror 1 can be used for vehicle lamp such as a headlight, a tail lamp, etc.

When the lighting unit 30 is used for the vehicle lamp, the lighting unit 30 can be used for the headlight having a light-emitting efficiency by coating a reflective surface such as aluminum layer and the like on an inner surface 31IS of the casing 31 and by using the light source 32, which emits substantially white light. When the lighting unit 30 is used for the vehicle lamp, the lighting unit 30 can be used for the tail lamp and/or a stop lamp having a light-emitting efficiency by coating a reflective surface such as aluminum layer and the like on an inner surface 31IS of the casing 31 and by using the light source 32, which emits red light. Similarly, when the lighting unit 30 is used for the vehicle lamp, the lighting unit 30 can be used for a turn signal lamp by using the light source 32, which emits amber light.

When the half mirror 1 is attached to the casing 31, the half mirror 1 can also be attached to the casing 31 so that the half mirror layer 2 faces the light source 32 as shown in FIG. 3c. Even when the lighting unit 30 is structured by such a location of the half mirror 1, the lighting unit 30 can enjoy the above-described performances such as the high thermal resistance, the chemical resistance and the like in common with the above-described location shown in FIG. 3b.

Accordingly, the light source 32 can also include a laser device having a high emitting-efficiency in common with a light emitting diode, a bulb, etc.

Next, the evaluation results of the half mirror 1 will now be described with reference to FIG. 4 to FIG. 7. Embodiments 1-3 for evaluating the performances of the half mirror 1 were manufactured as shown in FIG. 4. A polycarbonate resin as the base material 3 is located in the coating chamber of the sputtering equipment so as to face the chromium target, which is set at a distance of 165 millimeters from the polycarbonate. After the coating chamber was exhausted at a pressure of 2 to $4 \times 10^{-3}$ Pa, the argon gas having a flow of 82.5 sccm fills at the pressures of 1.5 Pa when Embodiment 1 is manufactured, 1.6 Pa when Embodiment 2 is manufactured and 2.6 Pa when Embodiment 3 is manufactured. In these cases, the sputtering power is set up at 1,500 W and the forming time is between 10 seconds and 20 seconds.

As a result, each of layer thicknesses of Embodiments 1 to 3 became 26 nanometers, 65 nanometers and 34 nanometers, respectively, as shown in FIG. 4. After forming the chromium layer on the polycarbonate resin, each of half mirrors of Embodiments 1 to 3 was manufactured by filling the air in the coating chamber of the sputtering equipment. Next, comparative embodiments CE-1, CE-2, CE-3, CE-4 and CE-5 were manufactured as follows.

The polycarbonate resin is located in the coating chamber of the sputtering equipment so as to face the chromium target, which is set at the distance of 165 millimeters from the polycarbonate. After the coating chamber was exhausted at a pressure of 2 to $4 \times 10^{-3}$ Pa, the argon gas having a flow of 15 sccm fills at the pressures of 0.09 Pa to 1.5 Pa, and the sputtering power is set up at 1,500 W to 6,000 W and the forming time is between 6 seconds and 8 seconds. As a result, each of layer thicknesses of Comparative Embodiments CE-1 to CE-5 became 25, 15, 30, 25 and 25 nanometers, respectively, as shown in FIG. 4. After forming the chromium layer on the polycarbonate resin, each of half mirrors of Comparative Embodiments CE-1 to CE-5 was manufactured by filling the air in the coating chamber of the sputtering equipment.

With respect to the embodiments 1-3 and the comparative embodiments CE-1 to CE-5, each of atomic concentrations of chromium elements, oxygen elements and carbon elements in a depth direction of the half mirror layers 2 was measured by X-ray photoelectron spectroscopy (XPS). Each of measuring data of the embodiment 1 and the comparative embodiments CE-2 and CE-3 are shown in FIG. 6 to FIG. 7 as representative examples, respectively, in which a horizontal axis is a depth from a top surface of the half mirror layers 2 and a vertical axis is the atomic concentration (at %).

The oxygen composition and O/Cr ratio were shown in FIG. 4 in accordance with each of the measuring data. Thermal resistance tests of the above-described testing samples were carried out under 120 degrees centigrade for 240 hours. Then, the testing samples were watched by a metallograph, and x-indications are marked in a column of the thermal resistance in accordance with each row of some testing samples, in which a crazing and/or a crack occur and also ○-indication are marked in the column of the thermal resistance in accordance with each row of other testing samples, which maintain a normal state without the crazing and the crack.

Moisture resistance tests of the testing samples were carried out at a temperature of 50 degrees centigrade and at a humidity of 98% for 40 hours in a constant temperature reservoir, and were left at room temperature for one hour. Then, the testing samples were watched by a visual contact, and x-indications are marked in a column of the moisture resistance in accordance with each row of some testing samples, in which at least one of a peeling and a white spot occurs and also ○-indication are marked in the column of the moisture resistance in accordance with each row of other testing samples, which maintain a normal state without the peeling and the white spot.

With respect to an acid resistance test, sulfuric acid ($H_2SO_4$) having a normality of IN of 0.2 mil liters was dropped on each of the testing samples, and each of the testing samples was left for one hour and was left at room temperature for one hour after being washed with water. Then, the testing samples were watched by a visual contact, and x-indications are marked in a column of the acid resistance in accordance with each row of some testing samples, in which at least a part of the half mirror layer disappears, and also ○-indication are marked in the column of the acid resistance in accordance with each row of other testing samples, which maintain a normal state.

With respect to an alkali resistance test, each of the testing samples was dipped in a liquid of potassium hydroxide (KoH) having a concentration of 1% for 10 minutes and was watched by a visual contact. The x-indications are marked in a column of the alkali resistance in accordance with each row of some testing samples, in which at least one of a peeling and a white spot occurs and the ○-indication are marked in the column of the alkali resistance in accordance with each row of other testing samples, which maintain a normal state without the peeling and the white spot.

With respect to a low thermal resistance test, after the testing samples were left at a temperature of −40 degrees centigrade for 2 hours and were increased to a temperature of 80 degrees centigrade (a humidity of 90%) for 40 hours in a constant temperature reservoir, and were left at the temperature 80 degrees centigrade and at the humidity of 90% for 2 hours and were deceased to the temperature of 80 degrees for 2 hours again. The one thermal cycle of 8 hours was repeated 10 times. Then, the testing samples were watched by the metallograph, and the x-indications are marked in a column of the low thermal resistance in accordance with each row of some testing samples, in which a crazing and/or a crack occur, and also the ○-indication are marked in the column of the low thermal resistance in accordance with each row of other testing samples, which maintain a normal state without the crazing and the crack a visual contact.

According to the evaluation results shown in FIG. 4, Embodiments 1 to 3 can perform the excellent thermal resistance, moisture resistance, acid resistance and low thermal resistance, wherein the O/Cr ration of the embodiments is from 0.55 to 0.86 and the O/Cr ration is 0.67 or more on the central line. Additionally, the oxygen composition in the chromium oxide layer can be 35 at % or more and can be 46 at % or less.

On the other hand, Comparative Embodiments CE-1 to CE-5 may not perform the excellent thermal resistance and low thermal resistance. The O/Cr ration of the comparative embodiments is from 0.13 to 0.63 and the O/Cr ration is 0.39 or less on the central line. Additionally, the oxygen composition in the chromium oxide layer can be 12 at % or more and can be 38 at % or less.

As described above, in the chromium oxide layers 2CO of Embodiments 1-3, which are manufactured under the pressure of the argon gas having 1.5 Pa or more and the sputtering power having 1,500 watts or less, the distributional minimum of the ratio of oxygen to chromium in the thickness direction of the half mirror layer 2 can be 0.55 or more, and also the distributional minimum amount of the oxygen in the chromium oxide layer in the thickness direction of the half mirror layer can be 35 atomic percent or more.

Accordingly, the chromium oxide layers 2CO of Embodiments 1-3 become a larger oxygen composition than the comparative embodiments CE-1 to CE-5. Because the O/Cr ratios of Embodiments 1-3 become a larger than these of the comparative embodiments CE-1 to CE-5, each of Embodiments 1-3 can include a larger oxygen compositions even on the central line. Thus, the disclosed subject matter can provide half mirrors having a high durability and thermal resistance, which can prevent the half mirrors from cracking even under various tough circumstances such as being repeatedly subjected to low and high temperatures.

According to the exemplary half mirrors, the exemplary half mirrors can be incorporated into lighting units such as vehicle lamps and lighting apparatuses such as room lights, outdoor luminaires, etc. The lighting units can include a light source, which emits various color lights including white color light. Thus, the disclosed subject matter can also provide the lighting units using the half mirror having a high durability, which can maintain a stable reflectivity for a long term and also can maintain a good appearance for a long-term use because the half mirror can prevent cracking therein even under tough circumstances. Additionally, the disclosed subject matter can provide the methods for manufacturing the half mirrors having a high durability in simple manufacturing processes as described above.

Various modifications of the above disclosed embodiments can be made without departing from the spirit and scope of the presently disclosed subject matter. For example, cases where the half mirror 1 is formed in a substantially plane shape are described. However, the half mirrors is not limited to this shape and can be formed in various shapes such as a curved shape, a ring shape, etc. In addition, the specific arrangement between components can vary between different applications, and several of the above-described features can be used interchangeably between various embodiments depending on a particular application of the lighting unit.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A half mirror which receives light and reflects a part of the light while transmitting another part of the light from a base material, the half mirror comprising:
    the base material, which has a first surface and a second surface formed in a substantially planar shape, the base material being made from a transparent material and comprising a polycarbonate resin; and
    a half mirror layer formed on at least one of the first surface and the second surface of the base material as a chromium oxide layer of only one layer having a layer thickness,
    wherein a minimum of a ratio of oxygen to chromium in a thickness direction of the half mirror layer toward the base material is at least 0.55, and a maximum of the ratio of oxygen to chromium in the thickness direction of the half mirror layer toward the base material is at most 0.86, and
    wherein a minimum amount of oxygen in the chromium oxide layer in the thickness direction of the half mirror layer toward the base material is at least 35 atomic percent, and a maximum amount of oxygen in the chromium oxide layer in the thickness direction of the half mirror layer toward the base material is at most 46 atomic percent.

2. The half mirror according to claim 1, wherein a ratio of oxygen to chromium on a central line in the thickness direction of the half mirror layer toward the base material is at least 0.67.

3. A lighting unit using the half mirror according to claim 2, the lighting unit comprising:
    a casing having an opening and an inner surface, the opening of the casing being attached to the half mirror; and
    a light source attached to the casing and facing the half mirror.

4. The lighting unit according to claim 3, wherein the inner surface of the casing is a reflective surface.

5. The half mirror according to claim 3, wherein the layer thickness of the chromium oxide layer of only one layer is 26 to 65 nm, and the chromium oxide layer of only one layer is exposed from the half mirror.

6. A method for manufacturing the half mirror according to claim 1, the method comprising:
    preparing the base material;
    forming a chromium layer on the base material by a sputtering method, wherein a pressure of argon gas in a coating chamber of a sputtering equipment is more than 1.5 Pa, and a power is less than 1,500 watts when a direct current (DC) is applied between a positive electrode connecting the base material and a negative electrode connecting a chromium target; and
    forming the chromium oxide layer on the base material by injecting oxygen or a gas including the oxygen in the coating chamber of the sputtering equipment.

7. A lighting unit using the half mirror according to claim 1, the lighting unit comprising:
    a casing having an opening and an inner surface, the opening of the casing being attached to the half mirror; and
    a light source attached to the casing and facing the half mirror.

8. The lighting unit according to claim 7, wherein the inner surface of the casing is a reflective surface.

9. The half mirror according to claim 7, wherein the layer thickness of the chromium oxide layer of only one layer is 26 to 65 nm.

* * * * *